US011037650B2

(12) United States Patent
Buyuktosunoglu et al.

(10) Patent No.: US 11,037,650 B2
(45) Date of Patent: *Jun. 15, 2021

(54) SELF-EVALUATING ARRAY OF MEMORY

(71) Applicant: International Business Machines Corporation, Armonk, NY (US)

(72) Inventors: Alper Buyuktosunoglu, White Plains, NY (US); Swagath Venkataramani, Yonkers, NY (US); Rajiv Joshi, Yorktown Heights, NY (US); Karthik V. Swaminathan, Mount Kisco, NY (US); Schuyler Eldridge, Ossining, NY (US); Pradip Bose, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/774,505

(22) Filed: Jan. 28, 2020

(65) Prior Publication Data

US 2020/0168290 A1    May 28, 2020

Related U.S. Application Data

(63) Continuation of application No. 15/621,281, filed on Jun. 13, 2017, now Pat. No. 10,607,715.

(51) Int. Cl.
*G11C 29/00* (2006.01)
*G11C 29/50* (2006.01)
(Continued)

(52) U.S. Cl.
CPC ......... *G11C 29/50004* (2013.01); *G06N 3/04* (2013.01); *G06N 3/063* (2013.01); *G06N 3/08* (2013.01); *G11C 2029/5004* (2013.01)

(58) Field of Classification Search
CPC ...... G11C 29/50004; G06N 3/04; G06N 3/08; G06N 3/063; G01R 31/3193
See application file for complete search history.

(56) References Cited

U.S. PATENT DOCUMENTS 5,557,619 A    9/1996  Rapoport
5,631,868 A    5/1997  Termullo, Jr. et al.
(Continued)

FOREIGN PATENT DOCUMENTS

EP    0849743 B1    3/2003

OTHER PUBLICATIONS

Buyuktosunoglu, et al., "Self-Evaluating Array of Memory," U.S. Appl. No. 15/887,115, filed Feb. 2, 2018.
(Continued)

*Primary Examiner* — Guy J Lamarre
(74) *Attorney, Agent, or Firm* — Heather Johnston

(57) ABSTRACT

A first voltage may be applied to a memory in a neural network. The memory may include one or more memory cells. A processor may determine that a first memory cell in the memory is faulty at the first voltage. The first voltage may be a low voltage. The processor may identify a first factor in the neural network. The first factor may have a low criticality in the neural network. The processor may determine to store the first factor in the first memory cell. The processor may store the first factor in the first memory cell.

17 Claims, 6 Drawing Sheets

(51) Int. Cl.
*G06N 3/063* (2006.01)
*G06N 3/04* (2006.01)
*G06N 3/08* (2006.01)

(56) References Cited

U.S. PATENT DOCUMENTS

| | | | |
|---|---|---|---|
| 5,845,315 | A | 12/1998 | Cutter |
| 5,950,181 | A | 9/1999 | Federl |
| 6,182,257 | B1 | 1/2001 | Gillingham |
| 6,622,269 | B1 | 9/2003 | Ngo et al. |
| 7,284,166 | B2 | 10/2007 | Zappa et al. |
| 7,869,293 | B2 | 1/2011 | Morein |
| 8,023,348 | B2 | 9/2011 | Kohler et al. |
| 8,065,244 | B2 | 11/2011 | Chen et al. |
| 9,431,126 | B2 | 8/2016 | Liu et al. |
| 10,417,563 | B1 | 9/2019 | Commons et al. |
| 10,607,715 | B2 * | 3/2020 | Buyuktosunoglu ...... G06N 3/08 |
| 2009/0164696 | A1 | 6/2009 | Allen et al. |
| 2010/0128521 | A1 | 5/2010 | Mizuguchi et al. |
| 2010/0182859 | A1 | 7/2010 | Kohler et al. |
| 2011/0090751 | A1 | 4/2011 | Manna et al. |
| 2011/0307828 | A1 | 12/2011 | Chilimbi et al. |
| 2013/0091395 | A1 | 4/2013 | Kukreja et al. |
| 2014/0317460 | A1 | 10/2014 | Kleveland et al. |
| 2016/0041893 | A1 | 2/2016 | Calcagno et al. |
| 2016/0358661 | A1 | 12/2016 | Vali et al. |
| 2018/0358110 | A1 | 12/2018 | Buyuktosunoglu et al. |

OTHER PUBLICATIONS

Accelerated Examination Support Document, U.S. Appl. No. 15/887,115, dated Feb. 1, 2018, 14 pgs.
Chen et al., "Eyeriss: An Energy-Efficient Reconfigurable Accelerator for Deep Convolutional Neural Networks," IEEE Journal of Solid-State Circuits, vol. 52, No. 1, Jan. 2017, pp. 127-138.
Chilimbi et al., "Project Adam: Building an Efficient and Scalable Deep Learning Training System," 3 pgs., printed Apr. 11, 2017.
Han et al., "EIE: Efficient Inference Engine on Compressed Deep Neural Network," Computer Science, Computer Vision and Pattern Recognition, 12 pgs., submitted Feb. 4, 2016, last revised May 3, 2016.
List of IBM Patents or Patent Applications Treated as Related, Jan. 28, 2020, 2 pgs.
Reagen et al., "Minerva: enabling low-power, highly-accurate deep neural network accelerators," 2016 ACM/IEEE 43rd Annual International Symposium on Computer Architecture, pp. 267-278, Jun. 18-22, 2016, Seoul, Republic of Korea.
Sequin et al., "Fault Tolerance in Artificial Neural Networks," 1990 IJCNN International Joint Conference on Neural Networks, 6 pgs., Jun. 17-21, 1990, IEEE.
Temam, "A Defect-Tolerant Accelerator for Emerging High-Performance Applications," ISCA '12 Proceedings of the 39th Annual International Symposium on Computer Architecture, pp. 356-367, vol. 40 Issue 3, Jun. 2012, IEEE.
Venkataramani, et al., "AxNN: energy-efficient neuromorphic systems using approximate computing," Proceedings of the 2014 international symposium on Low power electronics and design, pp. 27-32, La Jolla, CA, Aug. 11-13, 2014.
Wang et al., "A Built-In Self-Test and Self-Diagnosis Scheme for Embedded SRAM", pp. 45-50, IEEE, © 2000.

* cited by examiner

SELF-EVALUATING ARRAY OF MEMORY

CROSS-REFERENCE TO RELATED APPLICATION

This application is a continuation of U.S. patent application Ser. No. 15/621,281, which is now U.S. Pat. No. 10,607,715, filed on Jun. 13, 2017.

This invention was made with government support under HR0011-13C-0022 awarded by Defense Advanced Research Projects Agency. The government has certain rights to this invention.

BACKGROUND

The present disclosure relates generally to the field of machine learning, and more specifically to allocating critical weights in neural networks.

A neural network typically includes a large number of memories that are interconnected. In a typical scenario, a neural network receives an input and processes the input through each interconnected memory to reach an output. Each memory usually evaluates the input relative to a factor stored on the memory. The output in a neural network is then commonly recorded by the neural network and used to refine outputs for later inputs.

SUMMARY

Embodiments of the present disclosure include a method and system for evaluating memory cells in a memory in a neural network and storing factors on corresponding memory cells (e.g., high criticality weights on highly resilient memory cells, and low criticality weights on vulnerable memory cells). A first voltage may be applied to a memory in a neural network. The memory may include one or more memory cells. A processor may determine that a first memory cell is faulty at the first voltage. The first voltage may be a low voltage. The processor may identify a first factor in the neural network. The first factor may have a low criticality in the neural network. The processor may determine to store the first factor in the first memory cell. The processor may store the first factor in the first memory cell.

Other embodiments of the present disclosure include a method for testing memory cells and correcting faulty memory cells. A processor may generate a first test pattern. The first test pattern may include a first write operation at two or more voltages. The processor may apply the first test pattern to a memory in a neural network. The memory may include one or more memory cells. Each memory cell may attempt to perform the first write operation at each of the two or more voltages. The processor may determine, in response to applying the first test pattern that the memory, that a first memory cell does not operate correctly at a first voltage. The processor may determine that the first memory cell operates correctly at a second voltage. The second voltage may be above the first voltage.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
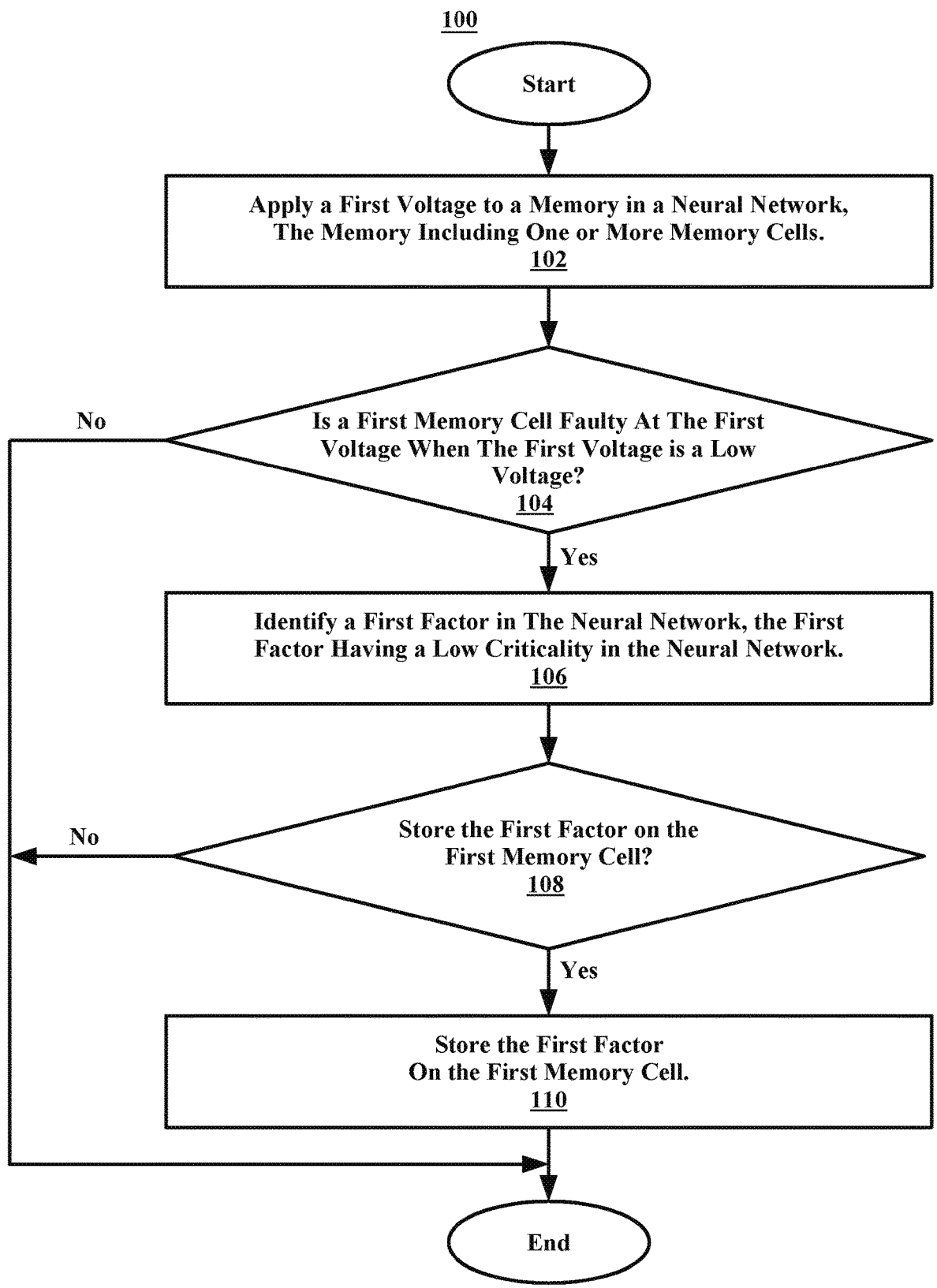
FIG. 1 illustrates a flowchart of an example method for storing a low criticality factor on a faulty memory cell, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the field of machine learning, and more specifically to allocating critical weights (e.g., sometimes referred to herein as factors) in neural networks to memory cells. While the present disclosure is not necessarily limited to such applications, various aspects of the disclosure may be appreciated through a discussion of various examples using this context.

Many institutions utilize machine-learning techniques to identify correlations and patterns previously hidden. Neural networks can be used, for example, to implement machine learning techniques. However, when a memory cell in a memory that is a part of a neural network (e.g., used for machine learning) becomes faulty, the institution may have to completely remove and replace the memory. Otherwise, the entire neural network may be compromised. It may not be cost effective to constantly replace memories when only a handful of memory cells in the memory are faulty. It can be advantageous to keep the memory in the neural network for as long as possible by allocating specific factors to select memory cells depending on the resiliency of the memory cells (e.g., if the memory cell is faulty or not). This may allow the memory to operate at previously inoperably low voltages (e.g., because the entire memory had to run on a higher voltage to ensure the faulty memory cell could operate correctly), increasing the energy efficiency of the computer system, and/or maximize memory yield by using faulty memory chips that would have previously been unusable.

In some embodiments, a first voltage may be applied (e.g., by a user, a processor, etc.) to a memory in a neural network. In some embodiments, the first voltage and/or voltages may be applied statically (e.g., before execution of a computation performed by the neural network). In some embodiments, the first voltage and/or voltages may be applied dynamically (e.g., during runtime of the computation performed by the neural network). The memory may include one or more memory cells. In some embodiments, a processor may determine that a first memory cell in the memory is faulty at the first voltage. In some embodiments, the first memory cell may be determined to be faulty if the memory cell has a logic value that does not transition at the first voltage (e.g., stuck at fault where the logic value in the memory cell is always 0 or 1). In some embodiments, the first memory cell may be determined to be faulty if a logic value transitions incorrectly (e.g., a transition fault where the logic value transitions from a 0 to 1 or 1 to 0 when it is not supposed to). In some embodiments, the first voltage may be a low voltage (e.g., minimum operating voltage for the memory, a voltage below a designed maximum voltage for the memory, etc.). In some embodiments, a low voltage may be a voltage below a predetermined threshold (e.g., below a maximum voltage, etc.). In some embodiments, the processor may identify a first factor in the neural network. In some embodiments, the first voltage may be a high voltage (e.g., a voltage above the minimum voltage, a maximum voltage for the memory, a voltage above a predetermined threshold, etc.).

In some embodiments, the processor (e.g., a memory controller) may categorize each memory cell (or a subset of the memory cells) according to the performance of the memory cell at the applied voltage. For example, the processor may determine which memory cells are resilient (e.g., exceed a high performance threshold), which cells are acceptable (e.g., exceed an acceptable performance threshold, but not the high performance threshold), which cells are vulnerable (e.g., operational, but do not meet the acceptable performance threshold), and which cells are faulty or inoperable. The processor may categorize the memory cells (or the subset, a different subset, etc.) at one or more voltages. For example, a memory cell that is resilient at a first voltage may only be acceptable at a lower voltage. Any number of categories may be used to group the memory cells based on their performance, and the present disclosure should not be limited to the various examples, which are described for illustrative purposes.

In some embodiments, the processor may identify a first factor in the neural network. The first factor may have a low criticality in the neural network (e.g., the factor may have a low impact on the outcome/output of the decision in the neural network). In some embodiments, criticality may be a numerical value, a certain criterion, a threshold, and/or any action that may have an impact on the outcome of the decision in the neural network. In some embodiments, the first factor may be identified by the processor as having a low criticality from previous (e.g., historical) inquiries to the neural network and the processor identifying that the outcome associated with the inquiries may not have been impacted by the first factor. In some embodiments, the processor may determine to store the first factor in the first memory cell, which was previously identified as faulty. In some embodiments, the processor may then store the first factor in the first memory cell.

For example, a static random access memory (SRAM) that is a part of a neural network may include four memory cells that are designed to operate at a minimum voltage of 0.6V. A processor may apply 0.6V to the SRAM and identify that one of the four memory cells does not operate at 0.6V (e.g., it needs a higher voltage applied to operate correctly). The processor may determine that the one memory cell is faulty for not operating correctly at the minimum voltage. The processor may additionally identify a factor in the neural network that has little to no effect on the output of the decision processed by the neural network. The processor may store the factor on the one memory cell.

As another example, a neural network may contain two factors, each of which having a two bit weight. The first factor may be critical (e.g., have a large impact on the final output), and the second factor may have a low criticality. If the processor identifies that one of the four memory cells is faulty and the other three are resilient, it may store both bits of information for the first factor in resilient memory cells, and one bit of information for the second factor in a resilient memory cell and the second bit for the second factor in the faulty memory cell. In some embodiments, the processor may store the least significant bit of the second factor in the faulty memory cell, and the most significant bit in the resilient memory cell. Likewise, in embodiments with more than two bits per factor, less significant bits may be stored in weaker memory cells and more significant bits may be stored in stronger memory cells.

This may be done in order to continue using the entire SRAM even though a memory cell is faulty. Additionally, the factor may still be considered (e.g., in the computing of the outcome of the decision for the neural network) even though it has little effect on the outcome of the decision processed by the neural network. In some embodiments, the processor may continue to increase the voltage in order to find the voltage that the one memory cell (e.g., the faulty memory cell) operates at (e.g., the processor may map the memory cells in the SRAM to determine the operating voltages of each of the memory cells). In some embodiments, the first voltage applied may be a high voltage and the processor may continue to decrease the voltage in order to find the voltage that the one memory cell correctly operates.

In some embodiments, the processor may determine to store the first factor in the first memory cell by further applying a second voltage to the memory cell in the neural network. The processor may then determine that the first memory cell in the memory is faulty at the second voltage. In some embodiments the second voltage may be a high voltage (e.g., a voltage above the minimum voltage).

Following the example above, the processor may apply a second voltage of 0.8V to the SRAM and determine that the one memory cell does not operate at 0.8V as well as the 0.6V. The processor may determine that the one memory cell in the SRAM is faulty at both voltages and determine to store the first factor (e.g., a factor having little to no effect on the outcome of the decision of the neural network) in the one memory cell. This may be done because even if the one memory cell does not work during the processing of the decision in the neural network, the factor was of little importance and would not affect the outcome drastically.

In some embodiments, the processor may determine that a second memory cell in the memory is not faulty at the first voltage. The processor may identify a second factor in the neural network. In some embodiments, the second factor may have a high criticality in the neural network (e.g., the factor may have a drastic effect on the outcome of the decision in the neural network). The processor may determine to store the second factor in the second memory cell. The processor may then actually store the second factor in the second memory cell.

For example, a memory in a neural network may include two memory cells that are designed to work at a minimum voltage of 0.5V. A processor may regulate a power supply in order to apply 0.5V to the three memory cells. The processor may determine that the first memory cell does not work at 0.5V (e.g., more voltage needs to be applied) and that the second memory cell does work at 0.5V (e.g., it is not faulty and works at the minimum/low voltage). The processor may identify a factor in the neural network that has a high influence over the output produced by the neural network and determine to store the factor in the second memory cell. The processor may then store the factor in the second memory cell. This may be done in order to assure that the neural network properly uses the factor at any given time. It may also allow the neural network to process information faster by having the higher criticality factors on lower voltage using memory cells.

In some embodiments, when determining to store the second factor in the second memory cell, the processor may apply a second voltage to the memory in the neural network. The processor may then determine that the second memory cell in the memory is not faulty at the second voltage. In some embodiments, the second voltage may be a high voltage.

Following the above example, the processor may additionally run the memory at 1V and determine that the second memory cell, in addition to properly functioning at 0.5V, functions at 1V. The processor may determine to store the second factor in the second memory cell because the processor has identified that the second memory cell can consistently process the high criticality factor at either voltage; assuring accurate and consistent usage of the factor at any given time.

In some embodiments, the processor may determine that a third memory cell in the memory is not faulty at the first voltage. The processor may also determine that the third memory cell in the memory is faulty at the second voltage. The processor may identify a third factor in the neural network. In some embodiments, the third factor may have standard (e.g., intermediate) criticality in the neural network. In some embodiments, the standard criticality may be below the high criticality and above the low criticality.

In some embodiments, a standard criticality factor may be a factor that is determined to have an effect on the outcome derived by the neural network that is below a threshold high criticality level and above a low criticality level. For example, a processor in a neural network may determine a factor has a high criticality if the factor affects the outcome of the neural network 80% or more of the time. The processor may additionally determine a factor has a low criticality if the factor affects the outcome less than 20% of the time. The processor may then deem a factor as having a standard criticality if the factor falls affects the outcome over 20% of the time but less than 80%. Any number of criticality thresholds may be used to group the factors based on their impact on the output, and the present disclosure should not be limited to the various examples, which are described for illustrative purposes.

The processor may determine to store the third factor on the third memory cell and store the third factor on the third memory cell. For example, a processor may map (e.g., the processor may identify which voltages work on which memory cells) the voltage usage of three memory cells in an SRAM. The processor may run two voltages, 0.5V and 0.8V, at different times through the three memory cells. The processor may determine that the first memory cell is faulty at both voltages, that the second memory cell is not faulty at both voltages and that the third memory cell is not faulty at 0.5V, but is faulty at 0.8V. The processor may determine to store a low criticality factor in the first memory cell (e.g., because the factor has little to no impact on the neural network).

The processor may determine to store a high criticality factor in the second memory cell (e.g., because the factor has a strong impact on the neural network). The processor may additionally determine to store a standard criticality factor on the third memory cell (e.g., because the factor has an intermediate/partial impact on the neural network). The processor may store the standard criticality factor on the third memory cell because it may be assumed that the factor will be processed at the low voltage, however, if a voltage surge or increase in voltage occurs, the factor's impact on the output of the neural network may be lost. In some embodiments, the standard criticality factor may be stored in any memory cell that works in a range between a minimum voltage and a maximum voltage. In some embodiments, the high criticality factor may be stored in any memory cell that works in a range that includes a minimum voltage up to and including a maximum voltage.

In some embodiments, the processor may determine that a third memory cell in the memory is faulty at the first voltage. The processor may additionally determine that the third memory cell in the memory is not faulty at the second voltage. The processor may identify a third factor in the neural network. In some embodiments, the third factor may have a low criticality in the neural network. The processor may determine to store the third factor on the third memory cell and store the third factor on the third memory cell.

For example, a processor may determine that a memory cell does not operate correctly at a minimum voltage but does operate correctly at an increased voltage. The processor may determine to store a low criticality factor in the memory cell. The processor may determine to do this because it may not be cost effective to run a memory at a higher voltage in order to have the one memory cell function properly. Additionally, if, for example, the factor has little to no effect on the outcome of the decision made by the neural network, it may be negligible to have the factor used at lower voltages. In some embodiments, increasing the voltage to the memory cell to include the factor in the outcome of the neural network can produce a more accurate outcome.

In some embodiments, the processor may apply a second voltage to all of the one or more memory cells included in the memory. In some embodiments, each of the one or more memory cells may include a logic value (e.g., a 0 or a 1). The processor may determine which memory cells of the one or more memory cells are faulty by identifying which memory cells do not transition the logic value to a second logic value (e.g., a stuck-at fault, a transition fault, etc.). For example, not transitioning the first logic value of 0 to the second logic value of 1. In some embodiments, the processor may additionally determine which memory cells of the one or more memory cells are not faulty by identifying which memory cells do transition the logic value to the second logic value at the second voltage (e.g., transitioning the first logic value of 0 to the second logic value of 1, or vice-versa).

In some embodiments, the processor may analyze one or more factors in the neural network. The processor may categorize each factor as having the low criticality, a standard criticality, or a high criticality. In some embodiments, the processor may determine the low criticality by analyzing historical outputs of the neural network and identifying the factor as being below a first threshold. For example, to produce an outcome in a neural network, a processor may have to use the factor of "time spent on a project." The processor may analyze a repository of historical outputs and identify that "time spent on a project," has been used as a factor in 5 of the last 100 historical outputs. The processor may determine that 5% is below a chosen threshold of 30% of historical outputs (e.g., placing the factor in a standard criticality range) and designate "time spent on a project" as having a low criticality in the neural network.

In some embodiments, the standard criticality may be determined by analyzing the historical outputs of the neural network and identifying the factor as being between the first threshold and a second threshold. In some embodiments, the second threshold may be higher than the first threshold. For example, a processor may determine from historical outputs that a factor is used 50% of the time in determining an outcome from the neural network. The processor may determine that the factor is used more often than a low criticality factor that is used less than 50% of the time (e.g., the first threshold), but below a high criticality factor that is used more than 50% of the time (e.g., the second threshold).

In some embodiments, the high criticality may be determined by analyzing the historical outputs of the neural network and identifying the factor as being above the second threshold. In some embodiments, the processor may assign each factor to a specific memory cell of the one or more memory cells based on the criticality of the factor and the fault of the specific memory cell. In some embodiments, low criticality factors may be assigned to faulty memory cells, and standard criticality and high criticality factors may be assigned to non-faulty memory cells.

In some embodiments, the processor may correct the one or more faulty memory cells in the memory. The processor may achieve this by increasing the first voltage to the first memory cell. The processor may determine that the first memory cell is not faulty at the increased voltage. The processor may maintain the increased voltage to the first memory cell. The processor may identify a second factor in the neural network. In some embodiments, the second factor may have a high criticality in the neural network. The processor may determine to store the second factor in the first memory cell.

For example, the processor may determine that the first memory cell does not work at 0.65V but does operate correctly at 0.8V. The processor may increase the voltage supply to the memory cell to 0.8V and maintain the voltage. The processor may then store a high critically factor to the first memory cell. The processor may store the high critically factor to the first memory cell because there may be assurance that the first memory cell is constantly working now at 0.8V.

In some embodiments, the processor may periodically check each memory cell by applying a loop (e.g., sequence, etc.) of voltages. This may ensure that the memory cells are constantly working at the correct voltage. In some embodiments, the processor may determine the voltage that all memory cells in a memory and/or in the neural network operate correctly at and maintain that voltage to all the memory cells.

In some embodiments, a processor may generate a first test pattern. In some embodiments, the first test pattern may include a first write operation at two or more voltages. The processor may apply the first test pattern to a memory in a neural network. In some embodiments, the memory may include one or more memory cells. Each memory cell may attempt to perform the first write operation at each of the two or more voltages. In some embodiments, the first test pattern may include testing pulse-width, noise, and/or frequency on the memory. In some embodiments, the first test pattern may include a read operation. In some embodiments, the first pattern may include both a read operation and a write operation.

In some embodiments, the processor may determine, in response to applying the first test pattern to the memory, that a first memory cell does not operate correctly at a first voltage. The processor may also determine that the first memory cell operates correctly at a second voltage. In some embodiments, the second voltage may be above the first voltage. For example, a processor may apply a pattern of voltages to a memory. The voltages may alternate as 0.5V and 1V, the processor may have the memory write an object to each of its memory cells at the 0.5V and the 1V voltages. The processor may determine that a memory cell in the memory did not write the object at 0.5V, but did write the object at 1V.

In some embodiments, the processor may increase the first voltage to the first memory cell. The first voltage may be increased to the second voltage. In some embodiments, the processor may maintain the increased voltage to the first memory cell. The processor may generate a second test pattern. The second test pattern may include a second write at one or more voltages above the second voltage. In some embodiments, one of the one or more voltages may be the second voltage.

In some embodiments, the processor may apply the second test pattern to the memory. Each memory cell in the memory may attempt to perform the second write operation at each of the one or more voltages above the second voltage. In some embodiments, the processor may determine, in response to applying the second test pattern to the memory, that each memory cell operates correctly at the one or more voltages above the second voltage. Following the example above, the processor may increase the voltage to the memory cell to 1V because the processor has determined that the memory cell works correctly at 1V. The processor may maintain the increased voltage to the memory cell so that the memory cell functions correctly during processing of a decision by the neural network.

The processor may generate a second test pattern that uses 1V and 1.3V. The processor may apply the second test pattern to the memory, which includes the memory cell, and identify that all memory cells correctly operate at the second test pattern voltages (e.g., they all performed the write operates at 1V and 1.3V). This may confirm that the memory cell operates correctly at anything over 1V or over.

In some embodiments, when determining that the first memory cell does not operate correctly at the first voltage, the processor may identify that the first memory cell did not perform the first write operation at the first voltage. In some embodiments, when determining that the first memory cell operates correctly at the second voltage, the processor may identify that the first memory cell performed the first write operation at the second voltage. In some embodiments, when determining that each memory cell operates correctly at the one or more voltages above the second voltage, the processor may identify that each memory cell performed the second write operation at each of the one or more voltages above the second voltage.

In some embodiments, the processor may identify an amount (e.g., the total number of voltages) of the two or more voltages that the first memory cell correctly operates. The processor may compare the amount to the total number of two or more voltages in the first test pattern (e.g., the total number of voltages correctly operated at out of the total number of voltages used in the first test pattern). The processor may determine (e.g., a percentage, ratio, etc.), from the comparing, that the amount is below a threshold value correctly operating.

In some embodiments, the processor may identify a lowest voltage of the two or more voltages at which the first memory cell correctly operates. The processor may apply the lowest voltage to the first memory cell. In some embodiments, the processor may maintain the lowest voltage to the first memory cell during use of the memory in the neural network.

For example, the processor may apply a test pattern that uses 10 different voltages. The processor may determine that a memory cell operates correctly at 6 of the 10 different voltages. The processor may determine that the memory cell does not operate correctly by being below an operating threshold of 80% (e.g., 8 out of the 10) the 10 different voltages. The processor may determine that out of the 6 voltages that the memory cell correctly operates at that 1.3V is the lowest voltage and apply that voltage to the memory cell in order for the memory cell to be correctly operating during use of the neural network.

In some embodiments, the first memory cell may have been determined to be faulty and a low criticality factor may have been stored in the first memory cell. The processor may then increase and maintain the voltage to the first memory cell. The voltage may be increased to (e.g., and maintained at) the lowest observable voltage that the first memory cell correctly operates. The processor may then replace the low criticality factor with a standard criticality factor or a high criticality factor because the first memory cell has been identified as operating correctly at the increased voltage.

Referring now to FIG. 1, illustrated is a flowchart of an example method 100 for storing a low criticality factor on a faulty memory cell, in accordance with embodiments of the present disclosure. In some embodiments, a processor may perform the method 100. In some embodiments, the method 100 may begin at operation 102.

At operation 102, a first voltage may be applied to a memory in a neural network. In some embodiments, the memory may include one or more memory cells. After operation 102, the method 100 may proceed to decision block 104. At decision block 104, a processor may determine if a first memory cell is faulty at the first voltage. In some embodiments, the first voltage may be a low voltage.

If at decision block 104, it is determined that the first memory cell is not faulty at the first voltage, the method 100 may end. If at decision block 104, it is determined that the first memory cell is faulty at the first voltage, the method 100 may proceed to operation 106. At operation 106, the processor may identify a first factor in the neural network. In some embodiments, the first factor may have a low criticality in the neural network (e.g., the factor may have little to no importance on the outcome produced by the neural network).

After operation 106, the method 100 may proceed to decision block 108. At decision block 108, the processor may determine to store the first factor in the first memory cell. If at decision block 108, the processor determines not to store the first factor in the first memory cell, the method 100 may end. In some embodiments, the processor may determine not to store the first factor in the first memory cell because the first factor is above a predetermined threshold for criticality. In some embodiments, the processor may determine not to store the first factor in the first memory cell because there may be another memory cell that is faulty at more than one voltage and the criticality is low enough to have no effect on the outcome produced by the neural network.

If at decision block 108, it is determined to store the first factor in the first memory cell, the method 100 may proceed to operation 110. At operation 110, the processor may store the first factor in the first memory cell. In some embodiments, after operation 110, the method 100 may end.

Figure 2:
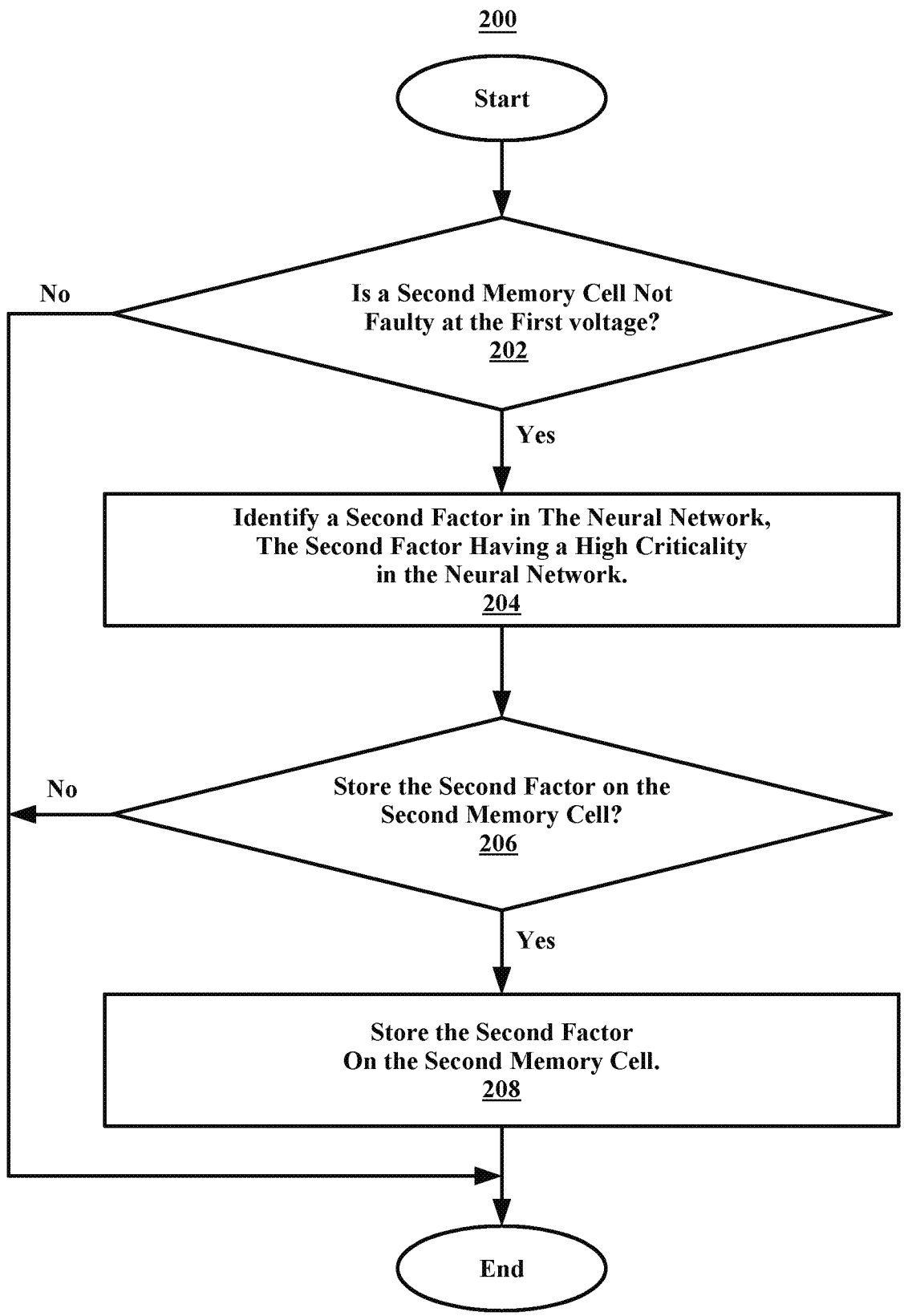
FIG. 2 illustrates a flowchart of an example method for storing a high criticality factor on a non-faulty memory cell, in accordance with embodiments of the present disclosure.

Referring now to FIG. 2, illustrated is a flowchart of an example method 200 for storing a high criticality factor on a non-faulty memory cell, in accordance with embodiments of the present disclosure. In some embodiments, a processor may perform the method 200. In some embodiments, the method 200 may be a part of the method 100 as illustrated in FIG. 1. In some embodiments, the method 200 may begin at decision block 202.

At decision block 202, a processor may determine if a second memory cell is not faulty at a first voltage. If, at decision block 202, it is determined that the second memory cell is faulty at the first voltage, the method 200 may end. If, at decision block 202, it is determined that the second memory cell is not faulty at the first voltage, the method 200 may proceed to operation 204.

At operation 204, the processor may identify a second factor in the neural network. In some embodiments, the second factor may have a high criticality in the neural network. After operation 204, the method 200 may proceed to decision block 206. At decision block 206, it may be determined to store the second factor in the second memory cell.

If, at decision block 206, it is determined not to store the second factor in the second memory cell, the method 200 may end. In some embodiments, it may be determined not to store the second factor in the second memory cell because the second factor does not meet a predetermined threshold to be considered of high criticality. In some embodiments, it may be determined not to store the second factor in the second memory cell because the second memory cell was faulty at a second or more voltage.

If, at decision block 206, it is determined to store the second factor in the second memory cell, the method 200 may proceed to operation 208. At operation 208, the processor may store the second factor in the second memory cell. After operation 298, the method 200 may end.

Figure 3:
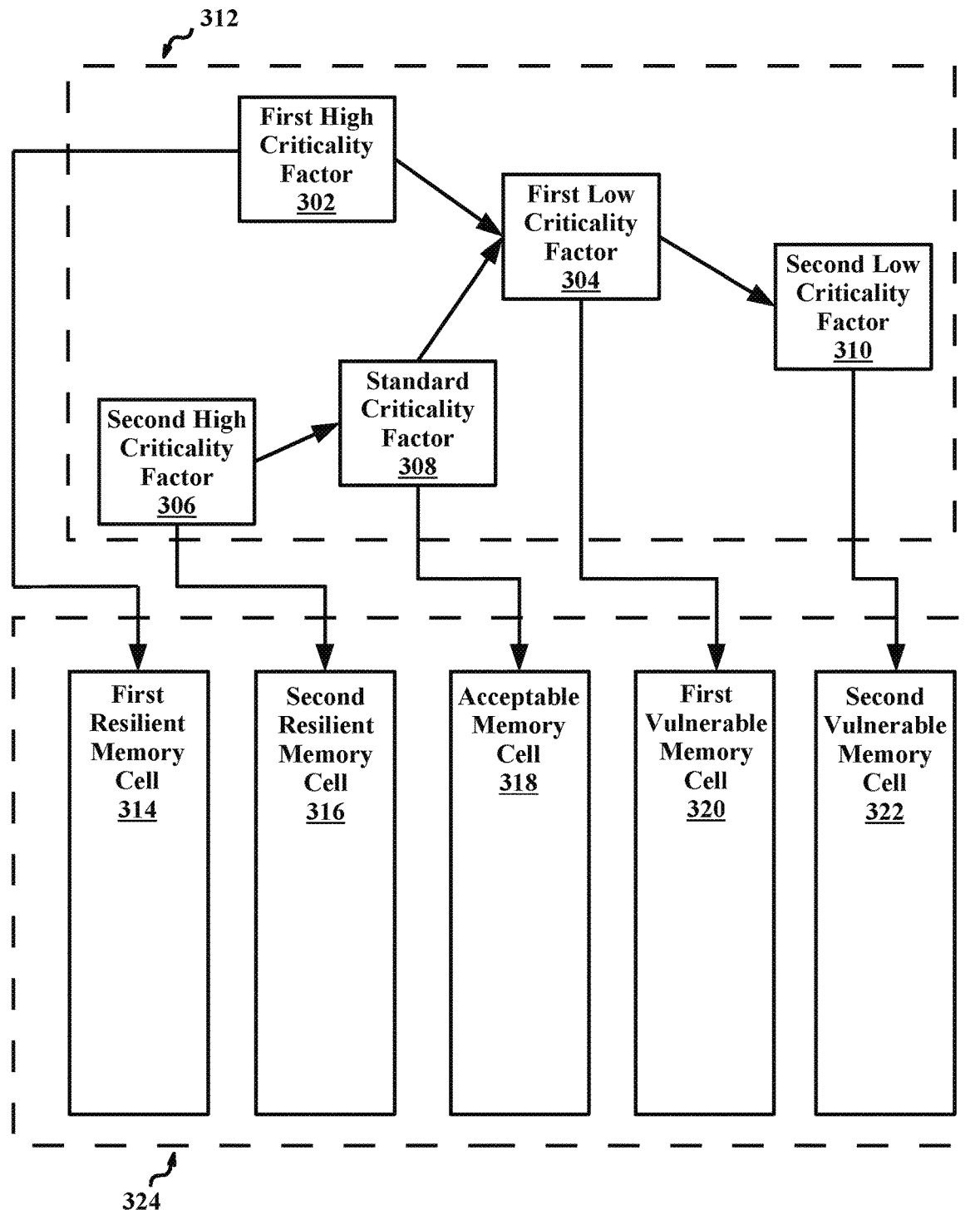
FIG. 3 illustrates an example system for storing factors in a neural network on memory cells, in accordance with embodiments of the present disclosure.

Referring now to FIG. 3, illustrated is an example system 300 for storing factors in a neural network on memory cells, in accordance with embodiments of the present disclosure. In some embodiments, the system 300 may include a neural network 312 and memory 324. In some embodiments, the neural network 312 may include a first high criticality factor 302, a first low criticality factor 304, a second high criticality factor 306, a standard criticality factor 308 (e.g., a standard factor), and a second low criticality factor 310. In some embodiments, each weight 302-310 may be associated with a specific factor (e.g., attribute of an input to be processed by the neural network) that is to be weighted. In some embodiments, the arrows connecting the weights 302-310 may indicate that factors associated with the weights 302-310 are interconnected. In some embodiments, the weights 302-310 may be located in memory cells that may be included in the neural network 312.

In some embodiments, the memory 324 may include a first resilient memory cell 314 (e.g., the memory functions correctly at all tested voltages, such as a minimum voltage and higher), a second resilient memory cell 316, an acceptable memory cell 318 (e.g., the memory cell functions correctly at the minimum voltage, but not at higher voltages), a first vulnerable memory cell 320 (e.g., the memory cell functions correctly at a higher voltages, but not the minimum voltage), and a second vulnerable memory cell 322.

In some embodiments, a processor may determine that the first high criticality factor 302 may be stored in the first resilient memory cell 314. The processor may additionally determine that the second high criticality factor 306 may be stored in the second resilient memory cell 315. That the standard criticality factor 308 may be stored in the acceptable memory cell 318, the first low criticality factor 304 may be stored in the first vulnerable memory cell 320, and that the second low criticality factor 310 may be stored in the second vulnerable memory cell 322.

For example, a doctor can use a cognitive computing system that includes a neural network, according to the embodiments of the disclosure, to identify if a patient has a certain type of cancer. The neural network may identify five factors that may contribute to the certain type of cancer. The neural network may identify the most important factor for the certain type of cancer to be genetics (e.g., identifying that 60% of people with the cancer have inherited it) and another important factor to be age (e.g., by identifying that 55% of people over 55 years old have the cancer). The neural network may additionally identify that diet has a small role to play in being diagnosed with the cancer (e.g., 10% of people who ate pizza everyday have the cancer). The neural network may then identify hair color and eye color as no importance to being diagnosed with the cancer (e.g., there is a 1% difference between each person that has the cancer and their hair color and eye color). The neural network may receive input such as the genetic history of the patient, the age, the diet, the hair color, and the eye color.

The neural network may additionally run a self-diagnosing voltage test that identifies which memory cells in the neural network operate properly at the given voltage. The voltage may be the minimum voltage (e.g., a low voltage) because the neural network may be designed or intended to operate at the lowest possible energy costs. The neural network may identify that two memory cells operate correctly 100% of the time at the voltage, that one memory cell operates correctly 70% of the time at the voltage, and that two memory cells operate correctly 10% of the time at the voltage. Instead of replacing the memory housing the memory cells, to complete the requested diagnosis, the neural network may place a most important factor, such as (for example) genetics, in one of the correctly operating memory cells.

The neural network may continue to place a second most important factors, such as age, into the second correctly operating memory cell and a third most important factor, such as diet, into the memory cell that correctly operates 70% of the time. The neural network may then place the lowest contributing factors of hair color and eye color, respectively, each in one of the memory cells that correctly operates 10% of the time. By allocating the memory cells in such a way, the neural network may be able to derive an accurate result regardless of whether the faulty memory cells (e.g., the ones that operate 70% and 10% of the time) process the lowest factors.

In some embodiments, the first high criticality factor 302 and the second high criticality factor 306 may be determined to be high criticality factors by how they are inputs to other weights in the neural network 312 and do not depend on any other factors. In some embodiments, the standard criticality factor 308 may be determined to be a standard criticality factor based on how it is input by one other factor (e.g., the second high criticality factor 306 as input to 308). In some embodiments, the first low criticality factor 304 and the second low criticality factor 310 may be determined to be low criticality factors by how they are input to or from other weights in the neural network 312.

In some embodiments, the memory cells that store each weight in the neural network 312 may be determined by the fault of each memory cell. For example, it may be determined that the first vulnerable memory cell 320 is faulty at a low voltage but operates correctly at a high voltage. It may be determined to store the first low criticality factor 304 in the first vulnerable memory cell 320, for example, because it has a low chance of affecting the output of the neural network.

In some embodiments, to identify which memory cells may be vulnerable (e.g., faulty) and which memory cells may be resilient (e.g., function properly at a designated voltage), a variety of various read/write patterns may be processed on each memory cell. For example, a voltage pattern of 0.5V, 0.8V, and 1V may be sent through each cell and a "0" (zero) or a "1" (one) may be written to the memory cell. If it is determined that the memory cell operates correctly at the given voltage, the memory cell may be identified as resilient at that voltage and given a "1." If it is determined that the memory cell operates incorrectly at the given voltage, the memory cell may be identified as vulnerable and given a "0." That is, if a memory cell functions correctly at 0.5V and 0.8V, but does not function correctly at 1V; the memory cell may be designated, for example, with 1, 1, and 0. This may indicate, for example, to a processor analyzing the memory cells that the memory cell operates correctly at lower voltages, etc.

Figure 4:
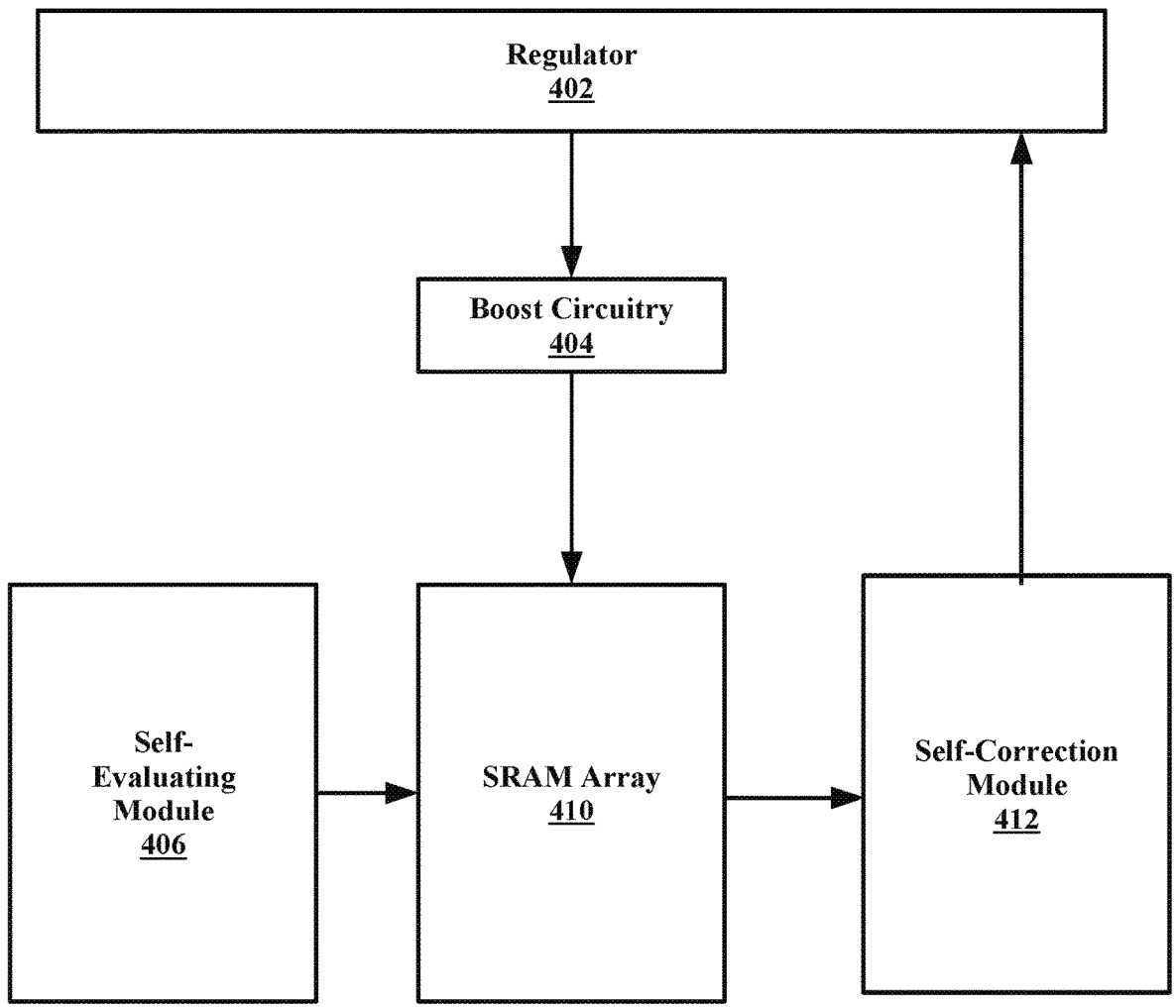
FIG. 4 illustrates an example system for a self-correcting neural network, in accordance with embodiments of the present disclosure.

Referring now to FIG. 4, system 400 is an example of a self-correcting neural network, in accordance with embodiments of the present disclosure. In some embodiments, the system 400 may include a regulator 402, boost circuitry 404, a self-evaluating module 406, an SRAM array 410, and a self-correction module 412. In some embodiments, the SRAM array 410 may be comprised of one or more memory cells. In some embodiments, the self-evaluating module 406 may include any built-in self-test, such as an Array Built-In Self Test (ABIST) unit. In some embodiments, the self-evaluating module 406 may use the ABIST unit to run a pattern of voltages through the SRAM array 410.

In some embodiments, the self-evaluating module 406 may include a dedicated processor that runs a pattern of voltages through the SRAM array 410. In some embodiments, the dedicated processor may run the voltage patterns at the same time (e.g., simultaneously) as the neural network is processing information. This may eliminate the need for a testing environment where the voltage patterns are run before operation of the neural network begins.

In some embodiments, the self-evaluating module 406 may include a dedicated processor that analyzes the access time delay in an individual memory cell located in the SRAM array 410. For example, an SRAM array may receive a request to write a piece of data in a memory cell. The SRAM may be designed to have an access time of 10 nanoseconds, however, a dedicated processor may identify that the SRAM is writing the piece of data in the memory cell in 15 nanoseconds. In some embodiments, the dedicated processor may correct the SRAM back to the designed access time by reducing noise. In some embodiments, the dedicated processor may be located outside of the self-evaluating module 406, that is, the dedicated processor may be a distinctive part of the neural network (not show in FIG. 4).

The self evaluating module 406 may identify which cells in the SRAM array 410 operate correctly at the determined voltages and which cells do not. In some embodiments, the self-correction module 412 may receive (e.g., from the self evaluating module 406 and/or the SRAM array) the information detailing which cells operate correctly at the determined voltages and which cells do not.

In some embodiments, the self-correction module 412 may use the information regarding the correctly and incorrectly operating cells to determine at which voltage each cell respectively operates efficiently. The self-correction module 412 may then send the determined voltages to the regulator 402. The regular 402 may alter the voltages for each cell in the SRAM array 410 and using the boost circuitry 404 apply the determined voltages to each cell in the SRAM array 410. This may allow for the SRAM array 410 to optimally operate at all times.

In some embodiments, the self-evaluating module 406 may periodically (e.g., set by a clock, every minute, etc.) test the SRAM array and the self-correction module 412 may be set to the same test period and may correct the SRAM array 410 through the use of the regulator 402 and the boost circuitry 404. In some embodiments, the self-evaluating module 406 may test the SRAM array 410 for frequency issues, pulse width issues, and/or noise issues in addition to voltage issues. In some embodiments, the self-correction module 412 can determine a solution for the frequency, pulse width, and/or noise issues and regulator 402 can implement a solution that corrects these issues.

For example, for frequency issues, regulator 402 may change the phase lock loop frequency. For pulse width issues, the regulator 402 may change the setting on a programmable clock block in the system 400 (which is not detailed in FIG. 4). For noise issues, the regulator 402 may boost the voltage for the memory as soon as the error rate is identified as increasing on account of the voltage drop.

Figure 5:
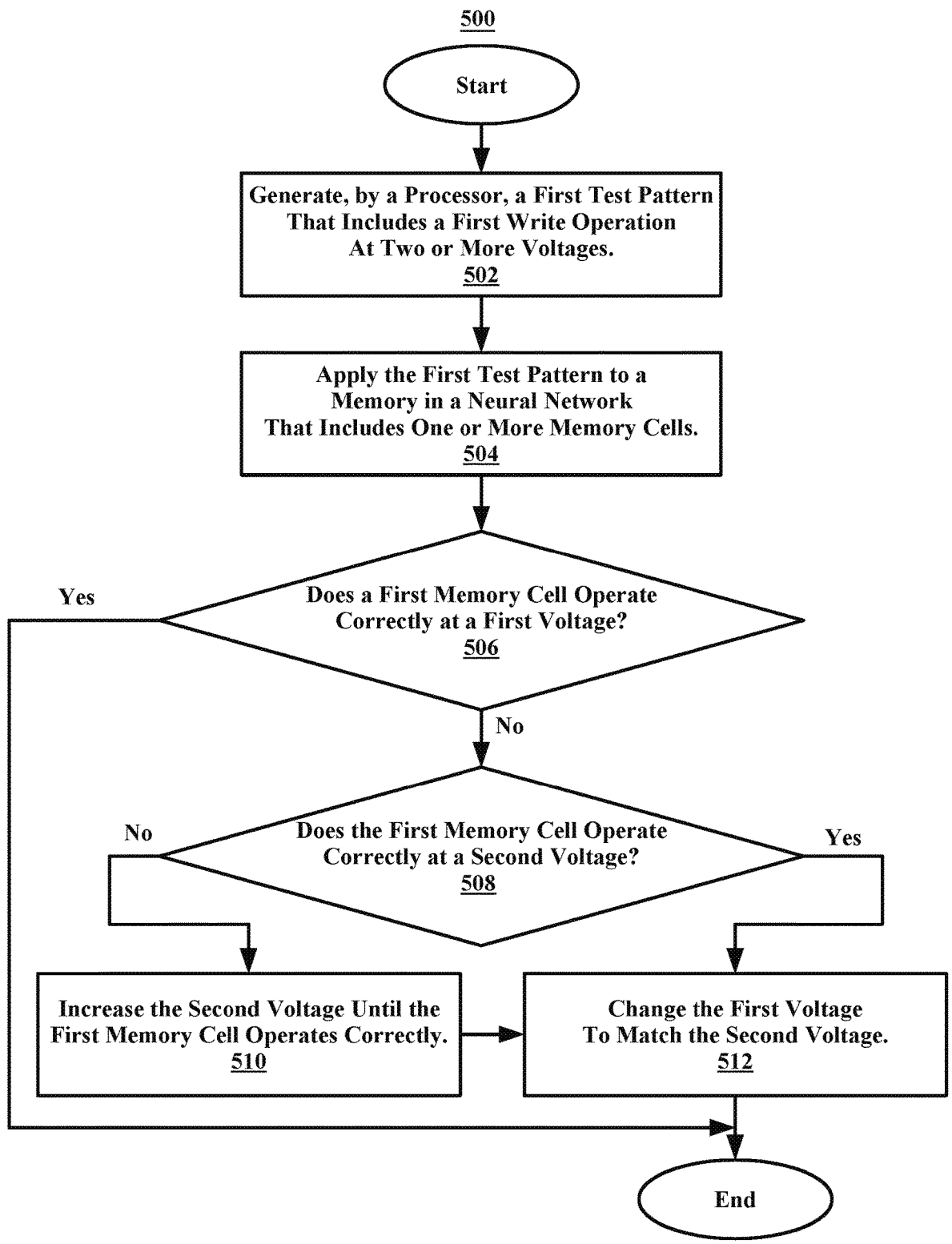
FIG. 5 illustrates a flowchart of an example method for determining which voltages a memory cell does and does not operate correctly, in accordance with embodiments of the present disclosure.

Referring now to FIG. 5, illustrated is a flowchart of an example method 500 for determining which voltages a memory cell does and does not operate correctly, in accordance with embodiments of the present disclosure. In some embodiments, a processor may perform the operations of the method 500. In some embodiments, the method 500 may begin at operation 502. At operation 502, a processor may generate a first test pattern. The first test pattern may include a first write operation at two or more voltages.

After operation 502, the method 500 may proceed to operation 504. At operation 504 the processor may apply the first test pattern to a memory in a neural network. The memory may include one or more memory cells. In some embodiments, each memory cell may attempt to perform the first writer operation at each of the two or more voltages (e.g., in response to the first test pattern being applied).

After operation 504, the method 500 may proceed to decision block 506. At decision block 506, the processor may determine whether or not a first memory cell in the memory operates correctly at a first voltage. If the first memory does operate correctly the method 500 may end. In some embodiments, this may be because the first voltage may be a nominal voltage that is the most efficient voltage for the memory cell to be at and it is unlikely that a fault is at higher voltages. If it is determined at decision block 506 that the first memory cell does not operate correctly at the first voltage, the method 500 may proceed to decision block 508.

At decision block 508, the processor may determine if the first memory cell operates correctly at a second voltage. In some embodiments, the second voltage may be above the first voltage. In some embodiments, the first voltage may be above the second voltage (e.g., the second voltage may be below the first voltage). If, at decision block 508, it is determined that the first memory cell does not operate correctly at the second voltage, the method 500 may proceed to operation 510.

At operation 510, the processor may increase the second voltage until the first memory cell operates correctly (e.g., at the second voltage). In some embodiments, the processor may decrease the second voltage until the first memory cell operates correctly. After operation 510, the method may proceed to operation 512. At operation 512, the processor may change the first voltage to match the second voltage. In some embodiments, this may be done because it has been determined that the second voltage is the lowest (e.g., efficient, etc.) voltage that the first memory cell can operate. In some embodiments, after operation 512, the method 500 may end.

In some embodiments, if it is determined at decision block 508 that the first memory cell does not operate correctly at the second voltage, the method 500 may end. In some embodiments, this may be because the first memory cell does not work at both the first and second voltages and the first memory cell may be deemed unsalvageable. In some embodiments, the processor may continue to apply more test patterns with more voltages to the first memory cell.

In some embodiments, if, at decision block 508, it is determined that the first memory cell does operate correctly at the second voltage, the method 500 may proceed to operation 512. At operation 512, the processor may change the first voltage to match the second voltage. For example, the processor may increase (or decrease) the voltage to the first memory cell to match the second voltage. In some embodiments, the processor may additionally maintain the increased (or decreased) voltage to the first memory cell for the duration of the first memory cell's usage in the neural network. In some embodiments, after operation 512, the method 500 may end.

Figure 6:
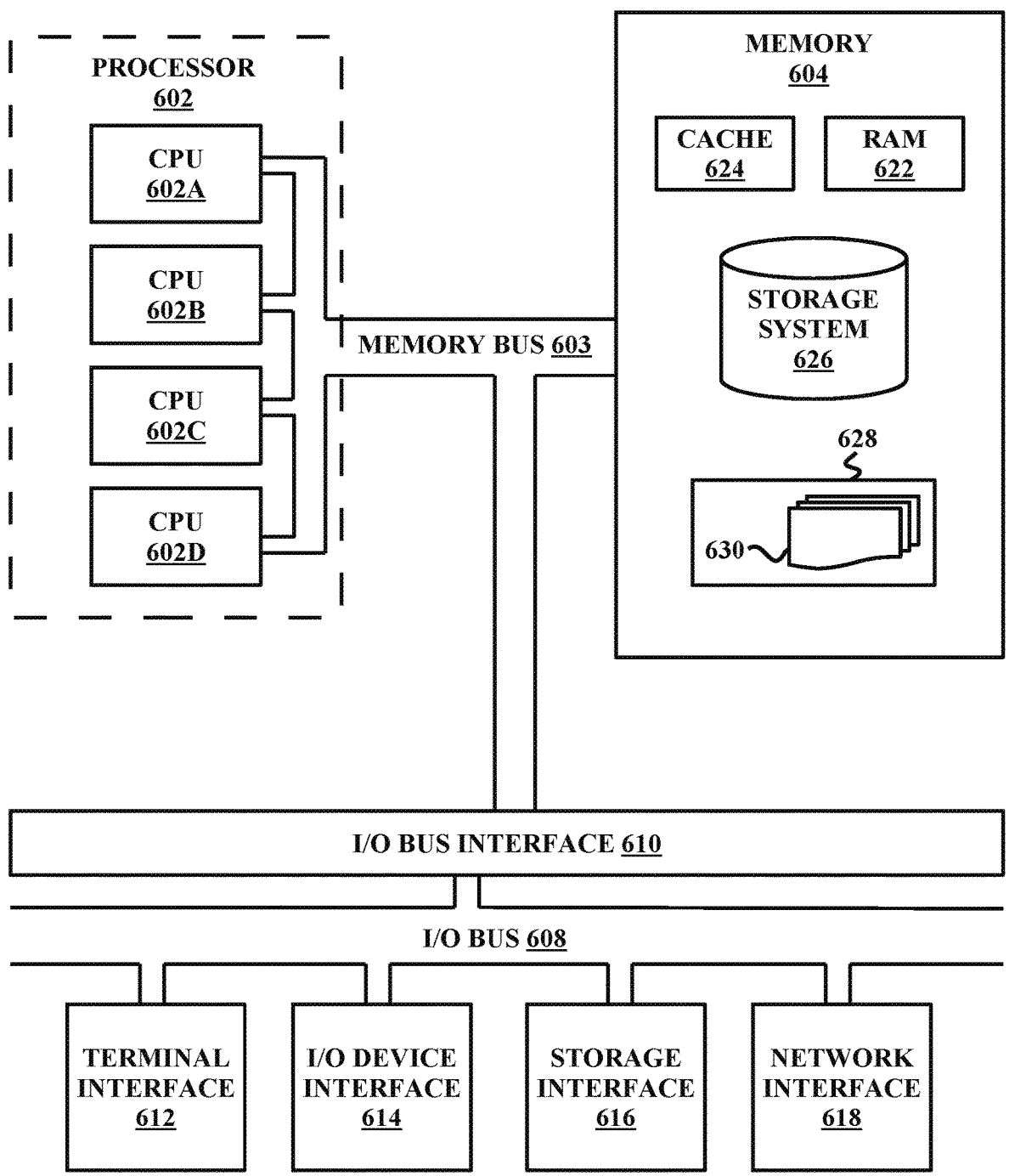
FIG. 6 illustrates a high-level block diagram of an example computer system that may be used in implementing one or more of the methods, tools, and modules, and any related functions, described herein, in accordance with embodiments of the present disclosure.

Referring now to FIG. 6, shown is a high-level block diagram of an example computer system 601 that may be used in implementing one or more of the methods, tools, and modules, and any related functions, described herein (e.g., using one or more processor circuits or computer processors of the computer), in accordance with embodiments of the present disclosure. In some embodiments, the major components of the computer system 601 may comprise one or more CPUs 602, a memory subsystem 604, a terminal interface 612, a storage interface 616, an I/O (Input/Output) device interface 614, and a network interface 618, all of which may be communicatively coupled, directly or indirectly, for inter-component communication via a memory bus 603, an I/O bus 608, and an I/O bus interface unit 610.

The computer system 601 may contain one or more general-purpose programmable central processing units (CPUs) 602A, 602B, 602C, and 602D, herein generically referred to as the CPU 602. In some embodiments, the computer system 601 may contain multiple processors typical of a relatively large system; however, in other embodiments the computer system 601 may alternatively be a single CPU system. Each CPU 602 may execute instructions stored in the memory subsystem 604 and may include one or more levels of on-board cache.

System memory 604 may include computer system readable media in the form of volatile memory, such as random access memory (RAM) 622 or cache memory 624. Computer system 601 may further include other removable/non-removable, volatile/non-volatile computer system storage media. By way of example only, storage system 626 can be provided for reading from and writing to a non-removable, non-volatile magnetic media, such as a "hard-drive."

Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 604 can include flash memory, e.g., a flash memory stick drive or a flash drive. Memory devices can be connected to memory bus 603 by one or more data media interfaces. The memory 604 may include at least one program product having a set (e.g., at least one) of program modules that are configured to carry out the functions of various embodiments.

One or more programs/utilities 628, each having at least one set of program modules 630 may be stored in memory 604. The programs/utilities 628 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Programs 628 and/or program modules 630 generally perform the functions or methodologies of various embodiments.

Although the memory bus 603 is shown in FIG. 6 as a single bus structure providing a direct communication path among the CPUs 602, the memory subsystem 604, and the I/O bus interface 610, the memory bus 603 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 610 and the I/O bus 608 are shown as single respective units, the computer system 601 may, in some embodiments, contain multiple I/O bus interface units 610, multiple I/O buses 608, or both. Further, while multiple I/O interface units are shown, which separate the I/O bus 608 from various communications paths running to the various I/O devices, in other embodiments some or all of the I/O devices may be connected directly to one or more system I/O buses.

In some embodiments, the computer system 601 may be a multi-user mainframe computer system, a single-user system, or a server computer or similar device that has little or no direct user interface, but receives requests from other computer systems (clients). Further, in some embodiments, the computer system 601 may be implemented as a desktop computer, portable computer, laptop or notebook computer, tablet computer, pocket computer, telephone, smart phone, network switches or routers, or any other appropriate type of electronic device.

It is noted that FIG. 6 is intended to depict the representative major components of an exemplary computer system 601. In some embodiments, however, individual components may have greater or lesser complexity than as represented in FIG. 6, components other than or in addition to those shown in FIG. 6 may be present, and the number, type, and configuration of such components may vary.

As discussed in more detail herein, it is contemplated that some or all of the operations of some of the embodiments of methods described herein may be performed in alternative orders or may not be performed at all; furthermore, multiple operations may occur at the same time or as an internal part of a larger process.

The present invention may be a system, a method, and/or a computer program product. The computer program product may include a non-transitory computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A computer-implemented method comprising:
    applying, by a memory controller, a first voltage to a memory in a neural network, wherein the memory includes one or more memory cells;
    determining that a first memory cell in the memory is faulty at the first voltage, wherein the first memory cell is determined to be faulty when the first memory cell does not transition a logic value at the first voltage;
    identifying a first factor in the neural network, wherein the first factor has a low criticality in the neural network;
    determining to store the first factor in the first memory cell;
    storing the first factor in the first memory cell; and
    operating all of the one or more memory cells at the first voltage.

2. The method of claim 1, wherein applying the first voltage to the memory in the neural network includes identifying that the neural network is performing a computation, and wherein the computation includes the first factor.

3. The method of claim 2, wherein the computation is a first test pattern, the first test pattern including the first memory cell performing a read operation and a write operation, and wherein the read operation and the write operation are associated with the logic value.

4. The method of claim 1, wherein determining to store the first factor in the first memory cell further comprises:
    applying a second voltage to the memory in the neural network; and
    determining that the first memory cell in the memory is faulty at the second voltage, wherein the second voltage is above the first voltage.

5. The method of claim 4, wherein applying the second voltage to the memory in the neural network includes applying the first and second voltage to the memory before a computation is performed by the neural network.

6. The method of claim 1, further comprising:
    determining that a second memory cell in the memory is not faulty at the first voltage;
    identifying a second factor in the neural network, wherein the second factor has a high criticality in the neural network;
    determining to store the second factor in the second memory cell; and
    storing the second factor in the second memory cell.

7. The method of claim 6, wherein determining to store the second factor in the second memory cell further comprises:
    applying a second voltage to the memory in the neural network; and
    determining that the second memory cell in the memory is not faulty at the second voltage, wherein the second voltage is above the first voltage.

8. The method of claim 7, further comprising:
    determining that a third memory cell in the memory is not faulty at the first voltage;

determining that the third memory cell in the memory is faulty at the second voltage;
identifying a third factor in the neural network, wherein the third factor has a standard criticality in the neural network, wherein the standard criticality is below the high criticality and above the low criticality;
determining to store the third factor in the third memory cell; and
storing the third factor in the third memory cell.

9. The method of claim 7, further comprising:
determining that a third memory cell in the memory is faulty at the first voltage;
determining that the third memory cell in the memory is not faulty at the second voltage;
identifying a third factor in the neural network, wherein the third factor has a low criticality in the neural network;
determining to store the third factor in the third memory cell; and
storing the third factor directly in the third memory cell.

10. The method of claim 1, further comprising:
applying a second voltage to all of the one or more memory cells included in the memory, wherein each of the one or more memory cells includes a respective logic value;
determining which memory cells of the one or more memory cells are faulty by identifying which memory cells do not transition their respective logic value to a second logic value at the second voltage;
determining which memory cells of the one or more memory cells are not faulty by identifying which memory cells do transition their respective logic value to the second logic value at the second voltage;
analyzing one or more factors in the neural network;
categorizing each factor as having the low criticality, a standard criticality, or a high criticality,
wherein the low criticality is determined by analyzing historical outputs of the neural network and identifying the factor as being below a first threshold,
wherein the standard criticality is determined by analyzing the historical outputs of the neural network and identifying the factor as being between the first threshold and a second threshold, and wherein the second threshold is higher than the first threshold, and
wherein the high criticality is determined by analyzing the historical outputs of the neural network and identifying the factor as being above the second threshold; and
assigning each factor to a specific memory cell of the one or more memory cells based on the criticality of the factor and the fault of the specific memory cell, wherein low criticality factors are assigned to faulty memory cells, and wherein standard criticality and high criticality factors are assigned to non-faulty memory cells.

11. A system comprising:
a memory; and
a processor in communication with the memory, the processor being configured to perform operations comprising:
applying, by a memory controller, a first voltage to a memory in a neural network, wherein the memory includes one or more memory cells;
determining that a first memory cell in the memory is faulty at the first voltage, wherein the first memory cell is determined to be faulty when the first memory cell does not transition a logic value at the first voltage;
identifying a first factor in the neural network, wherein the first factor has a low criticality in the neural network;
determining to store the first factor in the first memory cell;
storing the first factor in the first memory cell, and
operating all of the one or more memory cells at the first voltage.

12. The system of claim 11, wherein determining to store the first factor in the first memory cell further comprises:
applying a second voltage to the memory in the neural network; and
determining that the first memory cell in the memory is faulty at the second voltage, wherein the second voltage is above the first voltage.

13. The system of claim 11, wherein the operations further comprise:
determining that a second memory cell in the memory is not faulty at the first voltage;
identifying a second factor in the neural network, wherein the second factor has a high criticality in the neural network;
determining to store the second factor in the second memory cell; and
storing the second factor in the second memory cell.

14. The system of claim 13, wherein determining to store the second factor in the second memory cell further comprises:
applying a second voltage to the memory in the neural network; and
determining that the second memory cell in the memory is not faulty at the second voltage, wherein the second voltage is above the first voltage.

15. The system of claim 14, wherein the operations further comprise:
determining that a third memory cell in the memory is not faulty at the first voltage;
determining that the third memory cell in the memory is faulty at the second voltage;
identifying a third factor in the neural network, wherein the third factor has a standard criticality in the neural network, wherein the standard criticality is below the high criticality and above the low criticality;
determining to store the third factor in the third memory cell; and
storing the third factor directly in the third memory cell.

16. The system of claim 14, wherein the operations further comprise:
determining that a third memory cell in the memory is faulty at the first voltage;
determining that the third memory cell in the memory is not faulty at the second voltage;
identifying a third factor in the neural network, wherein the third factor has a low criticality in the neural network;
determining to store the third factor in the third memory cell; and
storing the third factor directly in the third memory cell.

17. The system of claim 11, further comprising:
applying a second voltage to all of the one or more memory cells included in the memory, wherein each of the one or more memory cells includes a respective logic value;
determining which memory cells of the one or more memory cells are faulty by identifying which memory cells do not transition their respective logic value to a second logic value at the second voltage;
determining which memory cells of the one or more memory cells are not faulty by identifying which memory cells do transition their respective logic value to the second logic value at the second voltage;
analyzing one or more factors in the neural network;
categorizing each factor as having the low criticality, a standard criticality, or a high criticality,
wherein the low criticality is determined by analyzing historical outputs of the neural network and identifying the factor as being below a first threshold,
wherein the standard criticality is determined by analyzing the historical outputs of the neural network and identifying the factor as being between the first threshold and a second threshold, and wherein the second threshold is higher than the first threshold, and
wherein the high criticality is determined by analyzing the historical outputs of the neural network and identifying the factor as being above the second threshold; and
assigning each factor to a specific memory cell of the one or more memory cells based on the criticality of the factor and the fault of the specific memory cell, wherein low criticality factors are assigned to faulty memory cells, and wherein standard criticality and high criticality factors are assigned to non-faulty memory cells.

* * * * *